(12) United States Patent
Servaes et al.

(10) Patent No.: US 6,215,356 B1
(45) Date of Patent: Apr. 10, 2001

(54) POWER AMPLIFIER ARRANGEMENT

(75) Inventors: Jan Louis Josephina Servaes, Waregem; Jean-Philippe Robert Adiel Cornil, Enghien, both of (BE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/478,196

(22) Filed: Jan. 5, 2000

(30) Foreign Application Priority Data

Jan. 29, 1999 (EP) .................................................. 99400210

(51) Int. Cl.[7] ............................ H03F 3/217; H03F 21/00; H03F 3/26
(52) U.S. Cl. ...................... 330/251; 330/207 A; 330/273
(58) Field of Search ................................ 330/251, 207 A, 330/273, 262

(56) References Cited

U.S. PATENT DOCUMENTS

| 3,772,606 | 11/1973 | Wachner . |
| 4,160,216 | * 7/1979 | Thornton ............................. 330/267 |
| 4,346,349 | 8/1982 | Yokoyama . |
| 4,688,001 | * 8/1987 | Dijkmans et al. ................... 330/273 |

FOREIGN PATENT DOCUMENTS

| 0 092 206 A2 | 10/1983 | (EP) . |
| 55 165 006 | 12/1980 | (JP) . |

OTHER PUBLICATIONS

Len Feldman, "Class G High Efficiency HI–FI Amplifier" Aug. 1976, pp. 47–49,87.
Raab, F., et al.: Average Efficiency of Class–G Power Amplifiers, IEEE 1986, p. 145.
Sampei, T., et al: "Highest Efficiency and Super Quality Audio Amplifier Using MOS Power FETS in Class G. Operation" IEEE 1978 pp. 300–307.

* cited by examiner

Primary Examiner—Robert Pascal
Assistant Examiner—Patricia T. Nguyen
(74) Attorney, Agent, or Firm—Sughrue, Mion, Zinn, Macpeak & Seas, PLLC

(57) ABSTRACT

An amplifier arrangement includes a class-G amplifier, biased by a first and a second pair of bias voltages, a drive control circuit and a second amplifier (C) biased by the second pair of supply voltages, the drive control circuit (DCD) thereby being adapted to turn on said second amplifier (C) at a higher input signal amplitude than the input signal amplitude at which the current in the class-G amplifier is internally switched over from the first pair to the second pair of bias voltages.

4 Claims, 2 Drawing Sheets

POWER AMPLIFIER ARRANGEMENT

BACKGROUND OF THE INVENTION

The present invention relates to an amplifier arrangement.

Such an amplifier arrangement is already known in the art, e.g. from the U.S. Pat. No. 3,772,606 "Multi-level power amplifier". Therein, amplifier arrangements consisting of a series connection of 4 transistors are shown. Indeed, in FIGS. 2 and 3 of this prior art document, a first pair of transistors 39 and 40, constituting a first emitter follower is coupled via a pair of diodes between a first pair of power supplies delivering a first pair of bias voltages. A second pair of power supplies, delivering to a second pair of power supply terminals a second pair of bias voltages of the same polarity and of larger amplitude than the first pair, is coupled between the outermost transistors 44 and 49 of FIGS. 2 and 3 of this prior art document.

This configuration of 4 transistors in series, is generally known as the bipolar or push-pull variant of a class-G amplifier.

The four input terminals of this prior art class-G amplifier variant are coupled to the input signal source via bias means, the latter corresponding to the drive control circuit of claim 1.

In FIG. 2 of this prior art document, this bias means correspond to a pair of resistors, denoted 47 and 48. In FIG. 3, the transistors are coupled in a different way to the input signal source, by means of a series connection of the resistors 60,56,58 and 62, and the two diodes 64 and 66. All these variants can however be considered as different embodiments of such a drive control circuit, which couples the input terminal of the arrangement to the different input terminals of the class-G power amplifier.

Such class-G power amplifiers have proven to be efficient from the point of view of power consumption. However, one major drawback is that they require a lot of silicon area if they have to be realized as an integrated circuit. Indeed, in for instance the bipolar or push-pull variant of the prior art embodiment, all four transistors have to be dimensioned such as to be able to deliver, resp. to sink, the largest possible power or current to, resp. from, the load. In applications such as audio amplifiers or Asymmetric Digital Subscriber Line amplifiers, this largest current is however only to be delivered in very exceptional circumstances. This is because the input signal has a high crest factor, meaning that in general, the input signal has a rather low average value, and that only in these very rarely occurring circumstances, the input signal peaks at this maximum level. Only in these circumstances this maximum current is to be delivered to the load. Nevertheless, since this high current is not only flowing through the transistors connected to the highest voltage power supplies, but also through the innermost transistors coupled to the lower voltage power supply, all four transistors are to be dimensioned to be able to carry these rarely occurring high currents.

SUMMARY OF THE INVENTION

An object of the present invention is thus to provide an amplifier arrangement of the above known type but requiring less chip area compared to the prior art class-G amplifier.

According to the invention, this object is achieved due to the fact that said amplifier arrangement further incorporates a second amplifier as is further described in the characteristic part of the claim 1.

The addition of a second amplifier, biased by the second pair of bias voltages, and coupled in parallel with the class-G amplifier, will result in that the rarely occurring current peaks will now be distributed amongst the second amplifier and the class-G amplifier. The composing transistors can thereby be kept much smaller than the original class-G amplifier transistors. Since embodiments of such a second amplifier may only include two transistors, the total transistor area of the resulting arrangement will considerably be smaller than the original class-G arrangement. This will be explicitly shown in a further paragraph. The drive control circuit will thereby still guarantee the normal class-G operation, whereby from the inner class-G transition point, the second amplifier will also turn on. This inner class-G transition point in general is reached for input voltages equal to or exceeding to the voltage values of the first pair of bias voltages Another characteristic feature of the present invention is that said second amplifier is a class-C amplifier.

In this way, also the power consumption of the total structure will still be comparable to that of the original class-G amplifier.

Yet a further characteristic feature of the present invention is mentioned in claim 3.

In some embodiments of the amplifier arrangement, not only the drive control determines the onset of the second amplifier, but also the resistance in the class-G amplifier. This will be explained into more detail in the descriptive part of this document.

Still a further characteristic feature of the present invention is described in claim 4.

This not only results in the reduction of the area of the complete arrangement, as compared to the prior art, but at the same time helps in realizing a difference in resistance in the current branches through both amplifiers. This difference thereby allows the current through the class-G amplifier to be rather limited. In addition, the output impedance of the complete amplifier arrangement can thereby also be tuned so as to obtain a smooth transition in operation from the class G to the class-G in parallel with the second amplifier.

BRIEF DESCRIPTION OF THE DRAWINGS

The above and other objects and features of the invention will become more apparent and the invention itself will be best understood by referring to the following description of an embodiment taken in conjunction with the accompanying drawings wherein.

DETAILED DESCRIPTION OF THE INVENTION

Figure 1:
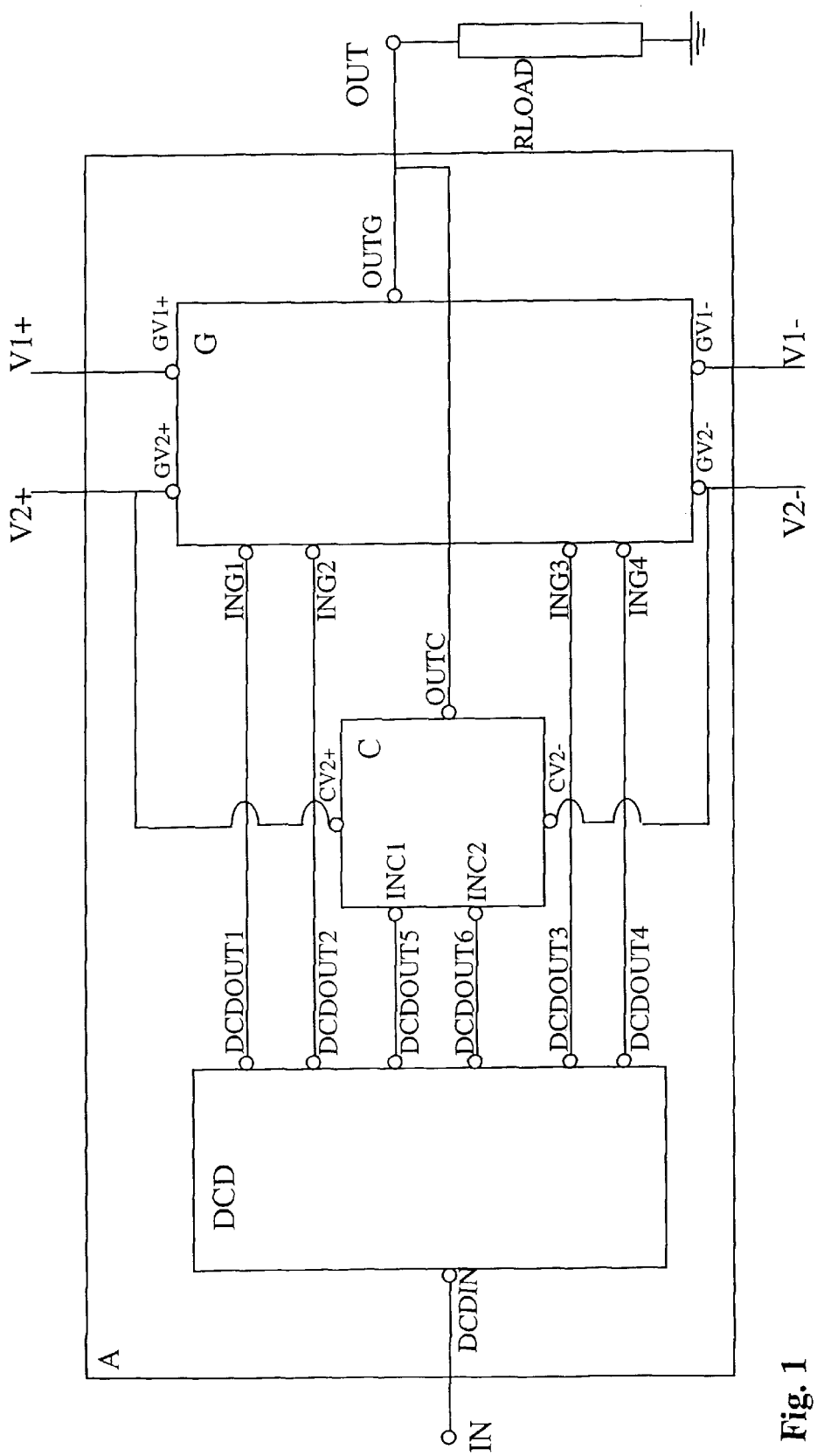
FIG. 1 depicts a block scheme of an amplifier arrangement A according to the invention.

A basic scheme of an amplifier arrangement A according to the invention is shown in FIG. 1. This amplifier arrangement includes a class-G amplifier G, which includes a first pair of supply terminals, GV1+ and GV1−, for receiving a first pair of bias voltages, V1+ and V1−. This class-G amplifier includes as well a second pair of supply terminals, GV2+ and GV2−, for thereon receiving a second pair of bias voltages, V2+ and V2−. In some embodiments the voltages of each of both pairs are of opposite polarity and equal in magnitude, for instance +5 and −5 V for the first pair and +10 and −10 V for the second pair. However other embodiments exist where the V1+ and V− are not lying symmetrical around the zero ground reference, and for instance correspond to +5 V and −2 V for the first pair, and +10 and −4 V for the second pair. One of the bias voltages of each pair may as well correspond to the ground or reference potential, for instance 0 and +5 V for V1+ and V1+, and 0 and +10 V for V2− and V2+ respectively. In the latter case, a unipolar variant of the class-G amplifier is used, in the aforementioned cases, a bipolar or push-pull variant of the class-G amplifier is used.

In any case, the voltages lying within the first range defined by the first pair of bias voltages, are also lying within the second range defined by the second pair of bias voltages, and this second range further overlaps this first range at least at one side of the first range. The second range is thus entirely covering and larger than the first range.

The amplifier arrangement A further includes an input terminal IN, which is coupled to an input terminal DCDIN of a drive control circuit DCD. In the schematic of FIG. 1, DCD has six output terminals, DCDOUT1 to DCDOUT6. Four of these output terminals DCDOUT1 to DCDOUT4 are coupled to respective input terminals INGI to ING4 of the class-G amplifier. Two remaining output terminals DCDOUT5 and DCDCOUT6, are coupled to respective input terminals INC1 and INC2 of a second amplifier C, also part of the amplifier arrangement. However other schemes of the amplifier arrangement exist, where the class-G amplifier has only two input terminals, and the second amplifier only one. This is for instance the case for the unipolar variants of the class-G amplifier. For these unipolar variants of the class-G amplifier, also a unipolar variant of the second amplifier is used in the amplifier arrangement, including only one input terminal. In this case the drive control circuit, which is adapted to control the operation of both amplifiers as a function of the signal at the input of the arrangement, thus also includes less output terminals.

Embodiments of both unipolar or bipolar variants of such class-G amplifiers are described in the cited prior art US patent application. Other embodiments however exist, which can be found in the specialized literature concerning power amplifiers.

An output terminal OUTG of the class-G amplifier is coupled to an output terminal OUT of the amplifier arrangement A.

The second amplifier C is biased by the second pair of bias voltages V2+,V2− by means of an additional pair of supply terminals denoted CV2+ and CV2− respectively. In FIG. 1, the second amplifier includes two input terminals INC1 and INC2. However, as was already briefly mentioned in a previous paragraph of this document, other embodiments exist whereby the second amplifier merely has one input terminal .

The output terminal OUTC of the second amplifier is as well coupled to the output terminal OUT of the amplifier arrangement. The latter is generally, but not necessarily, coupled via a load resistor RLOAD to the ground or reference terminal.

The drive control circuit DCD is adapted to control the operation of both amplifiers as a function of the input signal at the input terminal IN. Besides controlling the operation of the class-G amplifier itself, DCD is further adapted to regulate that the second amplifier will conduct current at larger or equal values of the input signal than these realizing the internal transition within the class-G amplifier.

By adding the second amplifier to the class-G amplifier high output currents to or from the load, are now distributed over both the class-G and the second amplifier. This has the advantage that the transistors of the class-G amplifiers can now be designed to be smaller than in a single class-G configuration, for driving or sinking this same current to or from the load. The resulting configuration thereby being much smaller than the original class-G amplifier, as will be explained into detail by means of the embodiment shown in FIG. 2.

In order to still have a power efficient amplifier arrangement, the second amplifier usually has a class-C amplifier configuration, the class-C operation further being obtained by a proper drive control circuit.

In addition, by designing the transistors of the second amplifier to be larger by a predetermined factor than the transistors of the class-G amplifier, the transition point between both amplifiers can be further influenced by this factor. The transition of the operation of the class-G amplifier to the second amplifier thus ot depends solely upon the operation of drive control circuit DCD itself.

Figure 2:
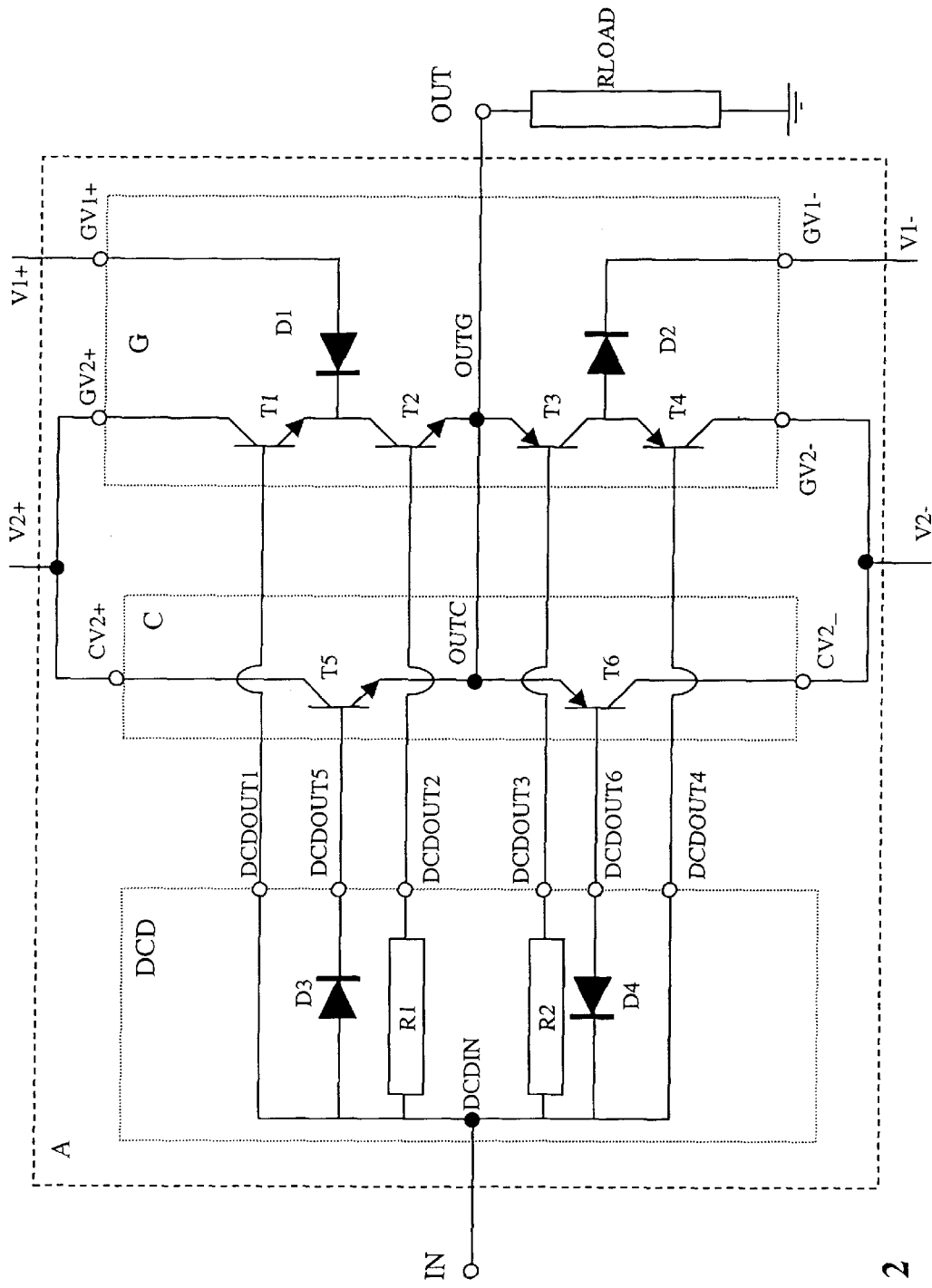
FIG. 2 presents a simple embodiment of the amplifier arrangement A of FIG. 1.

This will now be further explained by means of FIG. 2, which gives one possible embodiment of a push-pull variant of the subject amplifier arrangement. Remark that, in order to not overload the drawing, not all terminals of FIG. 1 are indicated. They will however be referred to in the following part.

As can be observed from this figure, the class-G amplifier consists of the well-known configuration of a series connection of four transistors: T1, T2, T3 and T4. T1 is an n-type transistor, its collector coupled to GV2+, its base constituting the first input terminal INGI of the class-G amplifier, its emitter being coupled to the collector of a second transistor, T2. The latter transistor is as well an n-type transistor, its base constituting a second input terminal ING2 of the class-G amplifier, its emitter constituting the output terminal OUTG of this class-G amplifier. The collector of T2 is coupled via a diode D1 with GV1+, so as to guarantee that for high input signals, T1 is delivering current via T2 to the load and not to GV1+. The emitter of T2 is coupled to the emitter of a third transistor T3, being a p-type transistor. The base of T3 constitutes a third input terminal ING3 of the class-G amplifier, the collector of T3 being coupled to the emitter of a fourth transistor T4 and to the anode of a second diode D2. The cathode of this second diode D2 is coupled to GV1−. T4 is as well a p-type transistor of which the collector is coupled to V2−, and the base constitutes a fourth input terminal ING4 of the class-G amplifier.

The second amplifier C consists of a very simple class-C amplifier composed of merely two transistors: T5 and T6. T5 is an n-type transistor, the collector of which is coupled to CV2+, the emitter of which constitutes the output terminal OUTC of this second amplifier and which is also coupled to the emitter terminal of T6. T6 is a p-type transistor, the collector of which is coupled to CV2−. The base of T5 constitutes a first input terminal INC1 of the second amplifier; the base of T6 constitutes a second input terminal INC2 of this second amplifier C. The output terminal OUTC of the second amplifier is coupled to the output terminal OUTG of the class-G amplifier and further via the load resistor RLOAD to the ground terminal.

In the embodiment of the drive control circuit DCD of FIG. 2 the input terminal DCDIN is directly coupled to the first output terminal DCDOUT1 and to the fourth output terminal DCDOUT4 of the drive control circuit DCD. Since the input terminal DCDIN also constitutes the input terminal of the amplifier arrangement A, and since DCDOUT1, resp. DCDOUT4, is directly coupled to ING1, resp. ING4, the input signal is thus directly applied to the base terminals of T1 and T4. The drive control circuit DCD further includes a third diode D3, the anode of which is coupled to DCDIN, the cathode of which is coupled to DCDOUT5. A fourth diode D4 is as well included in DCD, the cathode of D4 being coupled to DCDIN, the anode to DCDOUT6. DCD further includes a first resistor R1 coupled between DCDIN and DCDOUT2, and a second resistor R2 coupled between DCDIN and DCDOUT3.

The operation of this embodiment will now be explained. For values of the input signal between V1− and V1+, only transistors T2 and T3 of the class-G amplifier are conducting current. Indeed, for positive values of the input signal beneath V1+, diode D1 prevents transistor T1 from conducting current, whereas diode D3 prevents transistor T5 of the second amplifier from conducting current, since the voltage at the output follows the input voltage with a difference of the base-emitter voltage of T2. Therefore the base-emitter voltage of T5 will stay around zero, preventing T5 to turn on. For negative values of the input signal, but more positive than V1−, diode D2 prevents T4 from conducting current and diode D4 prevents T6 from conducting current for similar reasons as explained before for the positive voltages.

The remainder of the explanation will now be given for the case of positive input voltages. It will be obvious to a person skilled in the art to derive the same reasoning for the case of negative input voltages.

Whenever the input voltage exceeds V1+, transistor T2 is driven into saturation whereas transistor T1 will become active. Increasing the input voltage will force the emitter of T1 to follow this input voltage by a diode voltage difference, whereas T2 will be acting as a resistor with its saturation voltage across its collector and emitter. Diode D1 will be off.

Due to the current that is now flowing through transistors T1 and T2 to the load, and due to inherent resistances in transistors T1 and T2, such as the emitter and collector resistances, the voltage at the output terminal can reach the point where it equals the input voltage minus two times 0.7 V, being the built-in voltage for biasing a diode positively. From that moment on T5 of the second amplifier can conduct current as well, since its base-emitter diode will be forwardly biased. It is possible that due to the dimensions and the manufacturing process for transistors T1 and T2, the emitter resistance will not reach that critical value in order to have the necessary voltage drop of 1.4 V between the voltage at IN and OUT. In that case it will be necessary to add an extra resistor in series with T1 and T2.

Once the second amplifier is turned on, the partitioning of the total current through the load RLOAD, over the class-G and the second amplifier C will from that moment on entirely be based on the ratio between the resistances present in both parallel current paths. A first current path is situated in the second amplifier, through T5, a second in the class-G amplifier through T1 in series with T2. From the point of view of chip area, it will be desirable to have a much larger current flowing in T5, compared to T1 and T2. Indeed, in this case T5 has to be the largest transistor, accordingly carrying the largest current. T1 and T2 can then be kept smaller, thereby only allowing a smaller current through them. The total chip area of the complete arrangement will in this case be much lower than in the case of an arrangement merely including a class-G amplifier.

This can be easily understood by means of the following example: in a configuration where only one class-G amplifier is available, both T1 and T2 have to be dimensioned to carry a maximum current which is approximately equal to V2+ divided by RLOAD. This area is called AT1.

With the addition of the second amplifier, this same maximum current can now be divided over T5 and T1 in series with T2. Consider for instance the case where the area of T5 is about 80% of ATI and T1 and T2 are both 20% of ATI. How this ratio is chosen will be explained in a further paragraph. It is evident that (80%+20%+20%)*ATI is smaller than 2*ATI. By the fact that this whole configuration is again repeated for handling the negative input voltages, the effect is even more pronounced: 2.4*ATI compared to 4*ATI in the original class-G configuration. This thus means a savings of 40% in area. By even taking a larger transistor for T5, this savings can even be more pronounced.

As an inherent consequence of this asymmetry in the dimensions of the transistors in both current paths, the inherent resistance is larger in the class-G path of T1 and T2, compared to the class-C path through T5. Indeed, in case of bipolar transistors, the emitter and collector resistances scale more or less inversely proportionally with the emitter area, and consequently the transistor area. In case of MOS transistors, the width divided by the length of the transistor determines the current that can flow through it. Since in general a short length is taken, the transistor width thereby determines the area of the transistor. At the same time this ratio of the width divided by the length, also determines the inherent resistance. This resistance thus being inversely proportional to the transistor width.

In the configuration with the second amplifier in parallel with the class-G amplifier, the turn on of the second amplifier will thus in most cases automatically follow from the inherent resistance of the class-G amplifier transistors, since these are the smallest transistors. From then on, and in case of no extra resistance added in any of both paths, the second amplifier will take over at least 80% of the additional current, whereas the class G takes over at maximum 20% of this additional current, for the case of the above mentioned example, where a factor of 4 is used between the area of T5 and T1. Indeed, this follows from the fact that the resistance of T1 is in series with the resistance of T2, thereby again increasing the total resistance in the class-G path. For the embodiment of FIG. 2, following equations are valid for the positive swing of the input signal:

$$Vin - Vout - 1.4\ V = I_{T5} \cdot (R_{T1}/4)$$

$$Vin - Vout - Vsat_{T2} - 0.7\ V = I_{T1} \cdot 2 \cdot R_{T1}$$

$$I_{T1} + I_{T5} = Vout/Rload$$

Whereby Vin denotes the value of the input voltage, Vout the value of the output voltage, 1.4 V corresponds to the voltage drop over diode D3 and the base-emitter diode of T5, $Vsat_{T2}$ is the collector-emitter saturation voltage of transistor T2, a typical value being 0.2 V, 0.7 V corresponds to the voltage drop over the base-emitter diode of T1.

In general the transistors are designed to be able to carry their proportion of the maximum current through the load. The latter is entirely determined as V2+ divided by RLOAD. For a chosen factor between the areas of T5 and T1, which is chosen based on the values of V2+ and V1+ and RLOAD, their maximum currents can then be determined, and consequently their area.

It is evident that a lot of other embodiments exist for the drive control circuit. As a matter of fact, each existing drive control circuit for a particular embodiment of a class-G amplifier needs to be adapted so as to prevent the added second amplifier from turning on before the internal turn-on of the class-G amplifier, which normally occurs around voltages of V1+ for the positive swings of the input signal, or V1− for the negative swing of the input signal.

In FIG. 2 an embodiment is shown using bipolar transistors. It is however evident that the npn, resp. pnp, bipolar transistors can be replaced with nMOS, resp. pMOS transistors.

While the principles of the invention have been described above in connection with specific apparatus, it is to be clearly understood that this description is made only by way of example and not as a limitation on the scope of the invention, as defined in the appended claims.

What is claimed is:

1. Amplifier arrangement (A) including a class-G amplifier (G), said class-G amplifier including a first pair of supply terminals (GV1+,GV1−) adapted to receive a first pair of bias voltages (V1+,V1−), and a second pair of supply terminals (GV2+,GV2−) adapted to receive a second pair of bias voltages (V2+,V2−), the range of voltages between said second pair of bias voltages (V2+, V2−) entirely covering and being larger than the range of voltages between said first pair of bias voltages (V1+, V1−), said amplifier arrangement (A) including an input terminal (IN) coupled to an input terminal of a drive control circuit (DCD), said drive control circuit (DCD) includes at least two output terminals (DCDOUT1,DCDOUT2, DCDOUT3, DCDOUT4) coupled to at least two input terminals (ING1,ING2,ING3,ING4) of said class-G amplifier, said amplifier arrangement including an output terminal (OUT) coupled to an output terminal (OUTG) of said class-G amplifier characterized in that
said amplifier arrangement (A) further includes a second amplifier (C), an output terminal (OUTC) of which is coupled to said output terminal (OUT), said second amplifier (C) including an additional pair of supply terminals (CV2+,CV2−), adapted to receive said second pair of bias voltages (V2+,V2−), said drive control circuit (DCD) further includes at least one additional output terminal (DCDOUT5, DCDOUT6) coupled to at least one input terminal (INC1,INC2) of said second amplifier (C), said drive control circuit (DCD) thereby being adapted to turn on said second amplifier (C) at a higher or equal input signal amplitude than the input signal amplitude at which the current in said class-G amplifier is internally switched over from said first pair of supply terminals to said second pair of supply terminals.

2. Amplifier arrangement according to claim 1 characterized in that
said second amplifier is a class C amplifier.

3. Amplifier arrangement according to claim 1 characterized in that
the turn-on point of the operation of the second amplifier further depends on the resistance value in the current path of said class-G amplifier.

4. Amplifier arrangement according to claim 1 characterized in that
the composing transistors of said second amplifier have a larger area compared to the composing transistors of said class-G amplifier.

* * * * *